(12) United States Patent
Gong et al.

(10) Patent No.: US 10,811,734 B2
(45) Date of Patent: Oct. 20, 2020

(54) POWER BATTERY AND CELL STATE ACQUISITION APPARATUS THEREOF

(71) Applicant: Guangdong Hua'chan Research Institute of Intelligent Transportation System Co., Ltd., Shenzhen (CN)

(72) Inventors: Shugang Gong, Guangdong (CN); Yun Chen, Guangdong (CN); Shaobo Wu, Guangdong (CN); Tao Huang, Guangdong (CN); Wei Li, Guangdong (CN)

(73) Assignee: GUANGDONG HUA'CHAN RESEARCH INSTITUTE OF INTELLIGENT TRANSPORTATION SYSTEM CO., LTD., Shenzhen (CN)

( * ) Notice: Subject to any disclaimer, the term of this patent is extended or adjusted under 35 U.S.C. 154(b) by 280 days.

(21) Appl. No.: 15/300,429

(22) PCT Filed: Apr. 1, 2014

(86) PCT No.: PCT/CN2014/074526
§ 371 (c)(1),
(2) Date: Sep. 29, 2016

(87) PCT Pub. No.: WO2015/149275
PCT Pub. Date: Oct. 8, 2015

(65) Prior Publication Data
US 2017/0125855 A1    May 4, 2017

(51) Int. Cl.
*H01M 10/48* (2006.01)
*G01R 31/396* (2019.01)
(Continued)

(52) U.S. Cl.
CPC ............ *H01M 10/482* (2013.01); *B60L 3/12* (2013.01); *B60L 50/64* (2019.02); *B60L 58/21* (2019.02);
(Continued)

(58) Field of Classification Search
CPC .......................................... H01M 2/10–1094
See application file for complete search history.

(56) References Cited

U.S. PATENT DOCUMENTS

| 5,900,332 A * | 5/1999 | Marukawa | ............ | H01M 2/204 |
| | | | | 429/158 |
| 6,733,919 B1 * | 5/2004 | Nguyen | ................ | H01M 2/105 |
| | | | | 429/129 |

(Continued)

FOREIGN PATENT DOCUMENTS

| CN | 202634027 U | 12/2012 |
| WO | 2011096863 A1 | 8/2011 |
| WO | 2012060754 A1 | 5/2012 |

OTHER PUBLICATIONS

International Search Report of PCT/CN2014/074526 dated Nov. 26, 2014.
(Continued)

*Primary Examiner* — Eric R Smith
(74) *Attorney, Agent, or Firm* — Robert L. Stearns; Dickinson Wright PLLC

(57) ABSTRACT

A cell state acquisition apparatus and a power battery using the cell state acquisition apparatus. A cell state acquisition apparatus having an acquisition board assembly, a first interface fixed at the bottom surface of a cell, a second interface fixed at the top end of another cell and a connecting seat connecting the first interface and the second interface; the acquisition board assembly including a PCB board, a signal processing module and a communication module mounted on the PCB board and a fixed block which is
(Continued)

matched to be inserted in the first interface; and a signal acquisition module which is used for acquiring a cell state signal corresponding to the second interface is mounted on the fixed block. The signal acquisition module is integrated with the signal processing module and the communication module via the acquisition board assembly, and the connecting seat, the first interface and the second interface are provided to mount the acquisition board assembly between the cells which are connected in series, so that the use of a connection conductive line is reduced and shortened, and a layout space is saved, thus facilitating the heat dissipation of a cell.

26 Claims, 9 Drawing Sheets

(51) Int. Cl.
*G01R 31/3835* (2019.01)
*H01M 2/20* (2006.01)
*B60L 3/12* (2006.01)
*H01M 10/42* (2006.01)
*B60L 50/64* (2019.01)
*B60L 58/21* (2019.01)
*B60L 58/26* (2019.01)
*B60L 58/24* (2019.01)
*H01M 2/10* (2006.01)

(52) U.S. Cl.
CPC ............ *B60L 58/24* (2019.02); *B60L 58/26* (2019.02); *G01R 31/3835* (2019.01); *G01R 31/396* (2019.01); *H01M 2/1077* (2013.01); *H01M 2/206* (2013.01); *H01M 10/425* (2013.01); *H01M 10/4257* (2013.01); *H01M 10/4285* (2013.01); *H01M 10/486* (2013.01); *B60L 2240/545* (2013.01); *B60L 2240/547* (2013.01); *B60L 2240/549* (2013.01); *H01M 2220/20* (2013.01); *Y02T 10/7005* (2013.01); *Y02T 10/7061* (2013.01); *Y02T 90/16* (2013.01)

(56) References Cited

U.S. PATENT DOCUMENTS

| | | | | |
|---|---|---|---|---|
| 2008/0096104 | A1* | 4/2008 | Kim ...................... | H01M 2/105 429/158 |
| 2009/0104516 | A1* | 4/2009 | Yoshihara ............. | H01M 2/105 429/149 |
| 2013/0122341 | A1* | 5/2013 | De Paoli ............... | H01M 2/105 429/99 |
| 2013/0149578 | A1* | 6/2013 | Uchida ............... | H01M 2/1077 429/90 |
| 2013/0196181 | A1* | 8/2013 | Kim .................... | H01M 2/1055 429/7 |
| 2015/0104689 | A1* | 4/2015 | Frias .................... | H01M 2/204 429/121 |

OTHER PUBLICATIONS

Espacenet bibliographic data for CN Publication No. 202634027 published Dec. 26, 2012, 1 page.

* cited by examiner

US 10,811,734 B2

POWER BATTERY AND CELL STATE ACQUISITION APPARATUS THEREOF

TECHNICAL FIELD

The invention belongs to the field of electric vehicle's power battery; particularly, the invention claims a cell state acquisition apparatus and a power battery using the apparatus.

BACKGROUND

An electric vehicle is mainly powered by power batteries. As an electric vehicle requires a relatively high power and current, current power batteries are formed by encapsulating parallel-connected multiple cell groups, each of which is formed by connecting multiple cells in series. A cell is generally a relatively small rechargeable cell. The side and the bottom surface of a cell are generally negative and the top of a cell is generally provided with a metal cap, which is generally positive. As cells are inflammable and explosive materials, while a power battery is operating, its state parameters such as the temperature and voltage should be monitored all the time to control its charging and discharging in time so as to prevent danger. Real-time monitoring of each cell requires a signal acquisition module to acquire cell state signals, a signal processing module to process the acquired cell state signals, and a communication module to send processing results from the signal processing module to a main control module of electric vehicle so as to serve the function of real-time monitoring of each cell in a power battery. Such signal acquisition module, signal processing module and communication module of an electric vehicle's power battery are separated and connected using many long wires in the prior art, making it difficult to perform routing and hindering heat dissipation of cells in the power battery.

Technical Problem

The invention is intended to provide a cell state acquisition apparatus to solve the problem of signal acquisition module, signal processing module and communication module of a power battery being separated and connected using many long wires in the prior art, making it difficult to perform routing and hindering heat dissipation of cells in the power battery.

Technical Solution

The invention is embodied as a cell state acquisition apparatus for acquiring state signals of monitored cells. The apparatus comprises an acquisition board assembly placed between adjacent cells connected in series, a first interface fixed to the bottom surface of an adjacent cell connected in series, a second interface fixed to the top of another adjacent cell connected in series, and a connecting seat that connects the first interface and the second interface. The first interface and the second interface are inserted oppositely into the connecting seat. The acquisition board assembly comprises a printed circuit board (PCB), a signal processing module mounted on the PCB, a communication module mounted on the PCB, and a fixed block matched and inserted in the first interface. The PCB has a connecting part that can be inserted into the first interface. The fixed block is mounted on the connecting part. The fixed block is provided with a signal acquisition module for acquisition of the cell state signals corresponding to the second interface.

The invention is also intended to provide a power battery comprising multiple cells and the cell state acquisition apparatus, on which the cells are mounted.

Advantageous Effects of the Present Invention

The signal acquisition module, the signal processing module and the communication module are integrated via the acquisition board assembly, and the connecting seat, the first interface and the second interface are provided to connect the cells in series, with the acquisition board assembly mounted between the cells connected in series. This reduces and shortens connection wires, saves the layout space and increases the heat dissipation space and efficiency for the cells. Thereby, more cells can be set in the same volume, increasing the electric capacity of a power battery.

DETAILED DESCRIPTION OF THE PREFERRED EMBODIMENT

The present invention will now be described in detail with reference to the accompanying drawings representing preferred embodiments to more clearly clarify the purpose, technical solution and advantages of the invention. It should be understood that the preferred embodiments described herein are only to explain the invention and are not intended to limit the invention.

Figure 1:
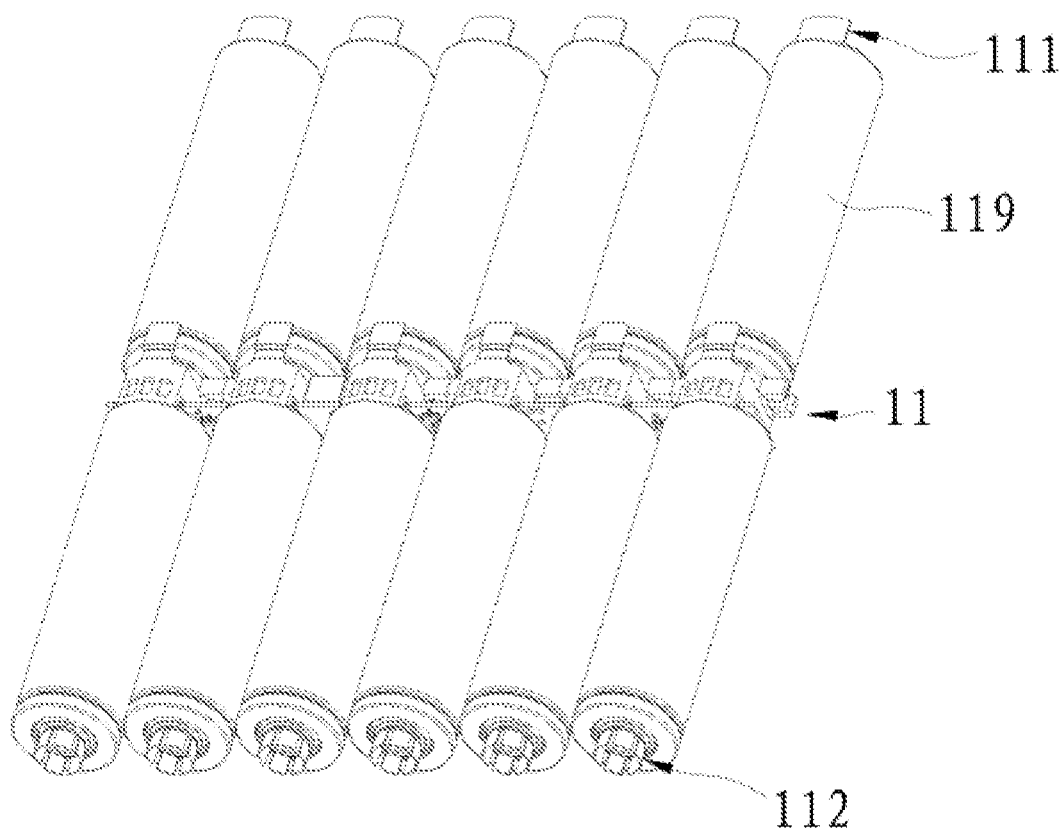
FIG. 1 depicts a perspective view of a cell state acquisition apparatus according to an embodiment of the invention and also shows the connection state of multiple groups of series-connected cells.
Figure 2:
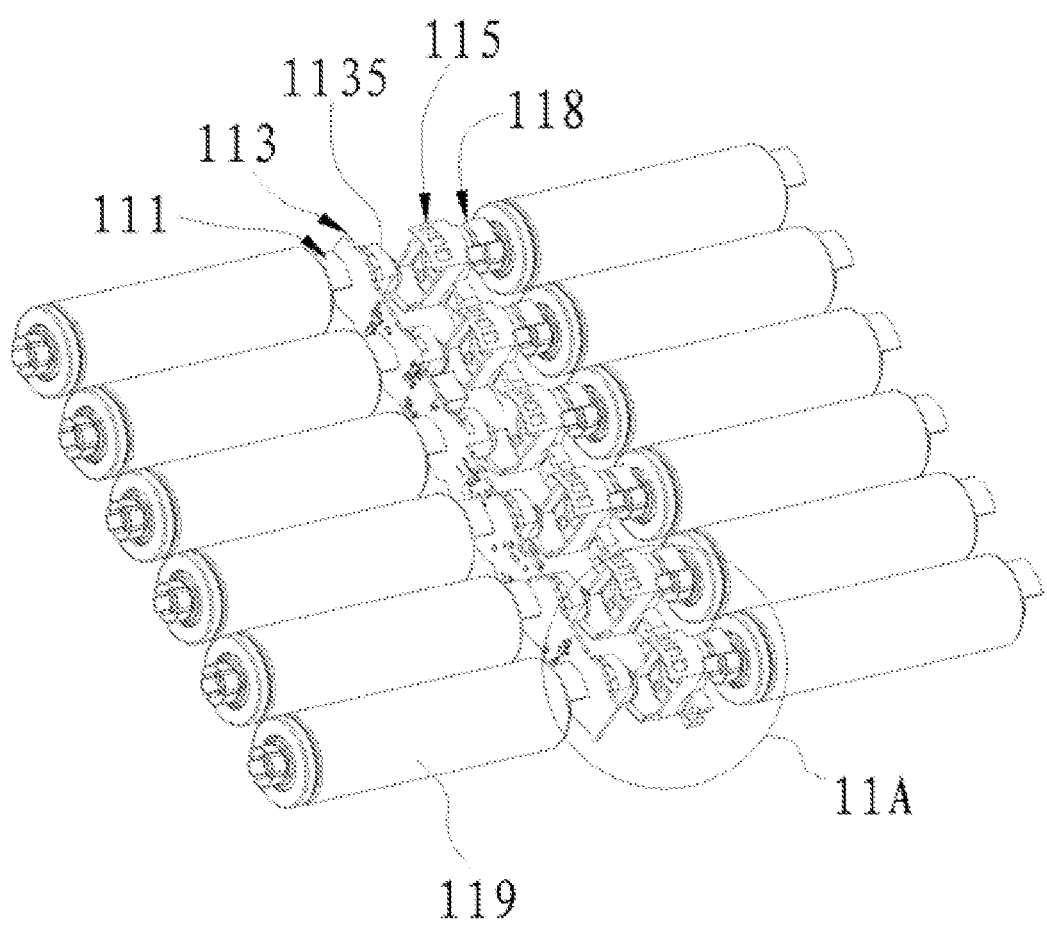
FIG. 2 depicts an exploded view of the cell state acquisition apparatus in FIG. 1.
Figure 3:
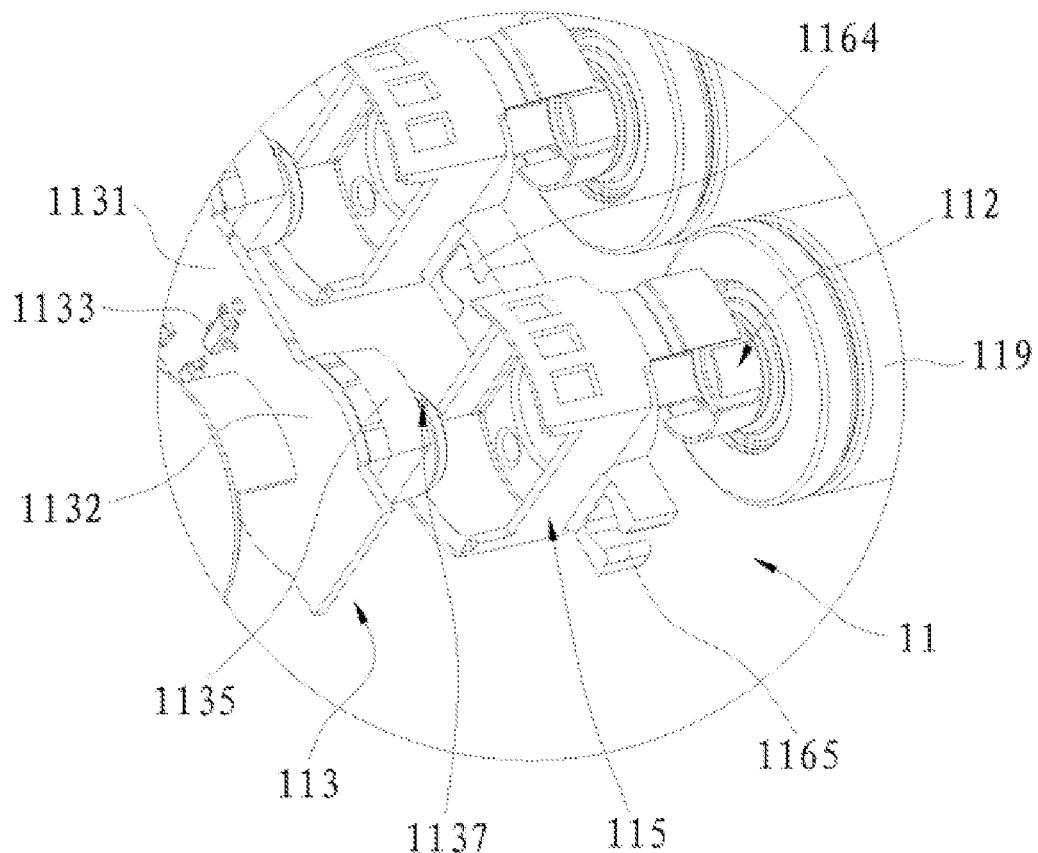
FIG. 3 depicts an enlarged view of the item 11A in FIG. 2.
Figure 7:
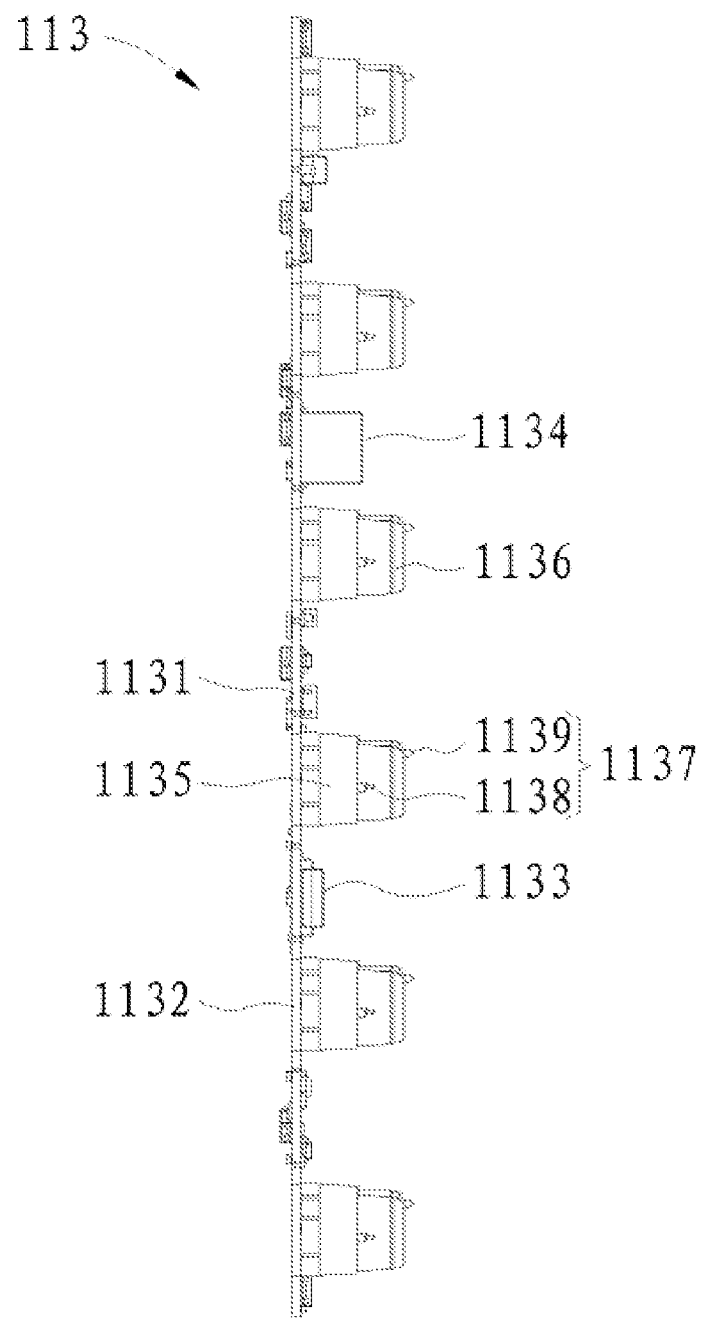
FIG. 7 depicts an enlarged view of the acquisition board assembly shown in FIG. 2.
Figure 8:
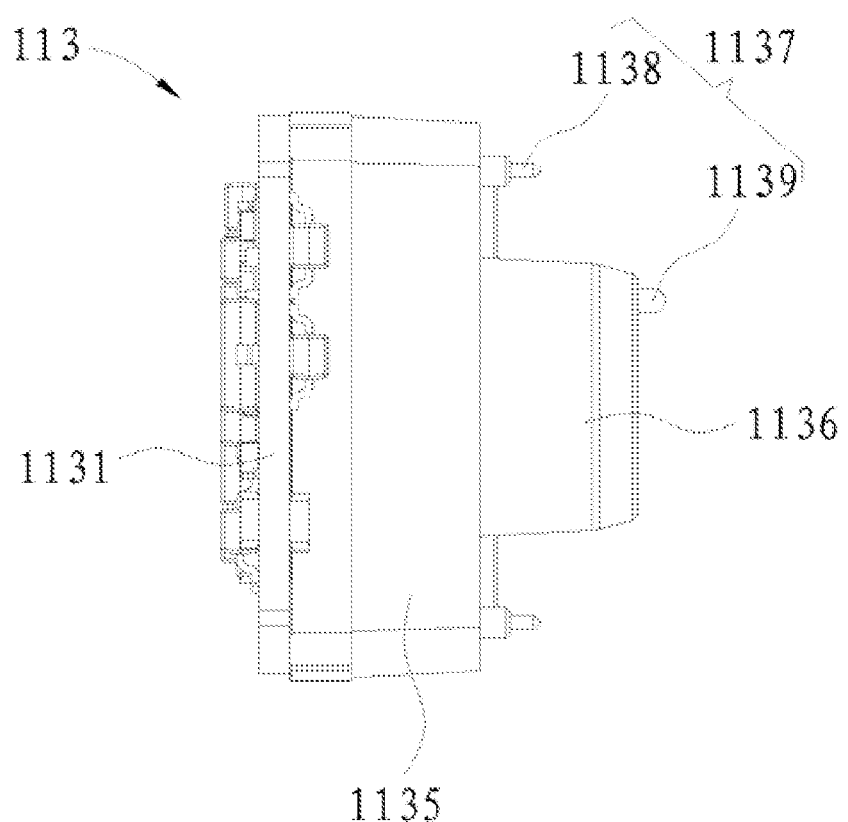
FIG. 8 depicts a top view of the acquisition board assembly shown in FIG. 7.

With reference to FIG. 1, FIG. 2 and FIG. 3, the invention is embodied as a cell state acquisition apparatus 11 for acquiring state signals of monitored cells 119. The apparatus comprises an acquisition board assembly 113, a first interface 111, a second interface 112, and a connecting seat 115. The first interface 111 is fixed to the bottom of the cell 119 as the negative electrode of the cell 119. The second interface 112 is fixed to the top of the cell 119 as the positive electrode of the cell 119. Two cells 119 can be connected in series by inserting the first interface 111 of one cell 119 into the connecting seat 115 and inserting the second interface 112 of the other cell 119 into the connecting seat 115. In this way, the connecting seat 115 connects the negative electrode of one cell 119 and the positive electrode of the other cell 119 and connects the two cells 119 in series. The first interface 111 and the second interface 112 are inserted opposite to each other into the connecting seat 115. This enables the connecting seat 115 to be placed between the two cells 119, reducing the space occupied by the connecting seat 115 and reducing the series connection length of two cells 119 and the space occupied by them accordingly. Together with further reference to FIG. 7 and FIG. 8, the acquisition board assembly 113 comprises a PCB 1131, a signal processing module 1133, a communication module 1136, and a fixed block 1135, on which a signal acquisition module 1137 is mounted. The signal processing module 1133 and the communication module 1136 are mounted on the PCB 1131. The PCB 1131 has a connecting part 1132 that can be inserted in the first interface 111. The fixed block 1135 is mounted on the connecting part 1132 of the PCB 1131 and can be matched and inserted in the first interface 111. In this way, the signal processing module 1133, the communication module 1136 and the signal acquisition module 1137 are integrated on the PCB 1131. This reduces and shortens connection wires, saves the layout space and increases the heat dissipation space and efficiency for the cells 119. The fixed block 1135 can secure the signal acquisition module 1137. The fixed block 1135 and the connecting part 1132 of the PCB 1131 are inserted in the first interface 111 and together with the first interface 111 inserted in the connecting seat 115, so that the signal acquisition module 1137 on the fixed block 1135 can acquire state signals of the cell 119 corresponding to the second interface 112, the signal processing module 1133 on the PCB 1131 then processes the signals, and the communication module 1136 sends processing results to the electric vehicle's main control module. This can also reduce space occupied the acquisition board assembly 113, increase the degree of integration, and save the layout space. In this embodiment, each cell 119 is provided with a first interface 111 on its bottom and a second interface 112 on its top to facilitate multiple cells 119 to be connected in series, and an acquisition board assembly 113 is mounted between each two of said multiple cells 119 connected in series to monitor the state of each cell 119 so as to ensure the safety and normal operation of the batteries.

The signal acquisition module 1137, the signal processing module 1133 and the communication module 1136 are integrated via the acquisition board assembly 113, and the connecting seat 115, the first interface 111 and the second interface 112 are provided to connect the cells 119 in series, with the acquisition board assembly 113 mounted between the cells 119 connected in series. This reduces and shortens connection wires, saves the layout space and increases the heat dissipation space and efficiency for the cells 119. Thereby, more cells 119 can be set in the same volume, increasing the electric capacity of a power battery.

Further, the PCB 1131 can be provided with multiple connecting parts 1132, each of which can be provided with a fixed block 1135. This enables multiple cells 119 to be connected in series. Specifically, a pair of two series-connected cells 119 can be connected to a fixed block 1135 via the connecting seat 115 so that one acquisition board assembly 113 can acquire and process state signals of multiple cells 119 and send processing results. This increases the degree of integration, further reduces wires and saves layout space. In this embodiment, the PCB 1131 is in a form of a long strip provided with six connecting parts 1132 along its length, each of which is provided with a fixed block 1135. This enables six cells 119 to be connected in series side by side, state signals of the six cells 119 to be acquired, processed and sent, and the six cells 119 to be secured and mounted conveniently. The long strip PCB 1131 can of course be provided with any other quantity (e.g., 5, 7, . . . ) of connecting parts and 1132 and fixed blocks 1135 to connect corresponding quantity of cells 119 in series. The PCB 1131 in another embodiment can of course takes the form of a triangle, pentagon or such others, with the connecting parts 1132 set at each angle of the PCB 1131. The center of the PCB 1131 may be designed as a circle, with the connecting parts 1132 set along its edge.

Figure 9:
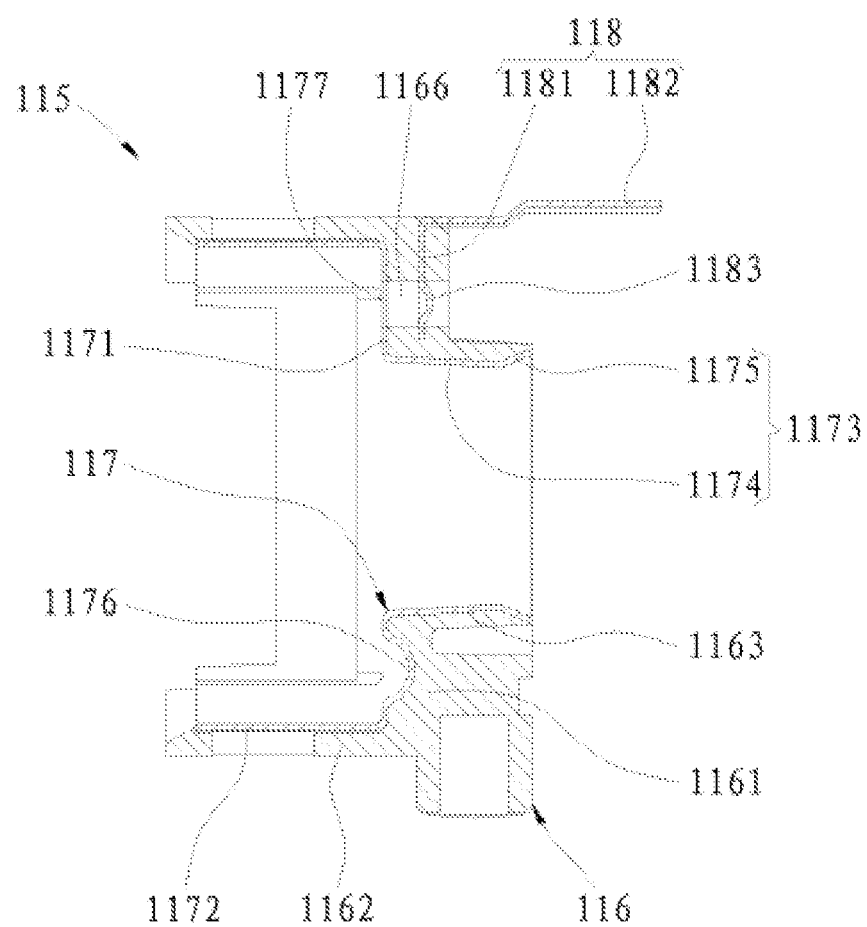
FIG. 9 depicts a sectional view of the connecting seat shown in FIG. 2.
Figure 11:
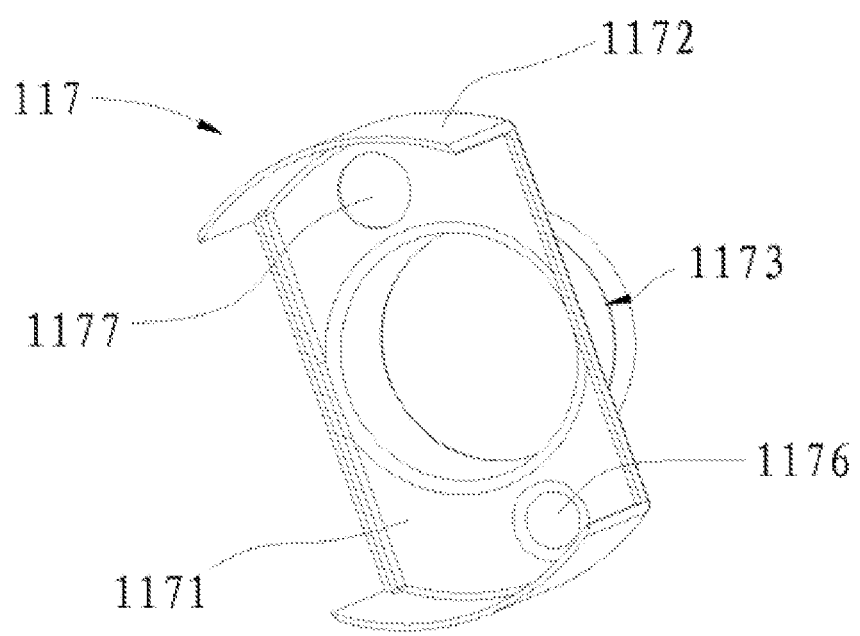
FIG. 11 depicts an enlarged perspective view of the connecting electrode for the connecting seat shown in FIG. 9.
Figure 12:
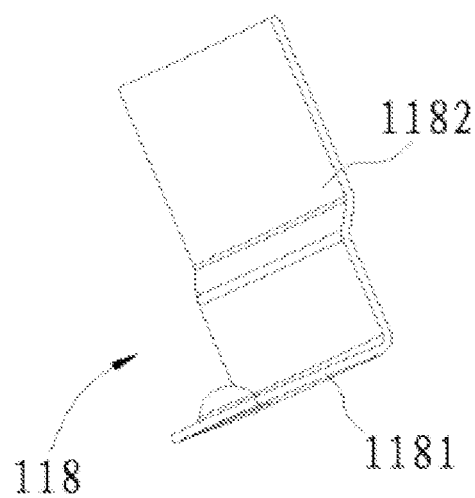
FIG. 12 depicts an enlarged perspective view of the pin electrode for the connecting seat shown in FIG. 9.

With reference to FIG. 3, FIG. 9 and FIG. 11, the connecting seat 115 comprises a connecting electrode 117 and an insulated enclosure 116 encasing the connecting electrode 117. The connecting electrode 117 electrically connects the first interface 111 and the second interface 112. This means that when the first interface 111 and the second interface 112 are inserted opposite to each other into the connecting seat 115, they become connected with connecting electrode 117 and thus electrically connected, causing the two cells 119 corresponding to the first interface 111 and the second interface 112 to be electrically connected. The connecting electrode 117 comprises a supporting plate 1171, a first side wall 1172 and a second side wall 1173. The first side wall 1172 and the second side wall 1173 are provided on two opposite sides of the supporting plate 1171. The first side wall 1172 is used to prop the relative outer surface of the first interface 111 so that when the first interface 111 is inserted in the connecting seat 115, the first interface 111 becomes electrically connected with the first side wall 1172. The second side wall 1173 is used to prop the relative outer surface of the second interface 112 so that when the second interface 112 is inserted in the connecting seat 115, the second interface 112 becomes electrically connected with the second side wall 1173. In this way, the first interface 111 and the second interface 112 become electrically connected.

With reference to FIG. 9 and FIG. 11, the first side wall 1172 is in two pieces at two opposite ends of the supporting plate 1171. The two pieces of the first side wall 1172 hold the relative outer surface of the first interface 111. This improves the connection stability and enables the first side wall 1172 and the first interface 111 to be better electrically connected.

With reference to FIG. 3, FIG. 9 and FIG. 11, the side of the fixed block 1135 can prop the relative inner surface of the first interface 111 so that when the first interface 111 is inserted in the connecting seat 115, the first interface 111 can be held by the connecting seat 115 and the fixed block 1135 to secure the first interface 111.

Further, the second side wall 1173 is provided at the edge of the supporting plate 1171. This can reduce the volume of the connecting electrode 117 and thereby reduce the volume of the connecting seat 115.

The second side wall 1173, in the shape of a sleeve, is provided on the middle part of the supporting plate 1171. The supporting plate 1171 has a first hole (not marked in drawings) in the position where the second side wall 1173 is set. The sleeve shape of the second side wall 1173 facilitates the second interface 112 to be inserted into the second side wall 1173 so that the second side wall 1173 can contact the relative outer surface of the second interface 112. Together with reference to FIG. 8, the first hole in the supporting plate 1171 facilitates the sensor of the signal acquisition module 1137 on the fixed block 1135 to extend into the second interface 112 to better detect the state of the cell 119.

The second side wall 1173 comprises a contraction section 1174, which contracts inwards from the supporting plate 1171 and along the axial direction of the second side wall 1173. The contraction section 1174 can hold the second interface 112 and prevent it from falling off when the second interface 112 is inserted in the second side wall 1173, so that the second interface 112 and second side wall 1173 are more stably connected.

The second side wall 1173 also comprises a guiding section 1175, which expands outwards from the contraction section 1174 and along the axial direction of the second side wall 1173. The guiding section 1175 facilitates the second interface 112 to be inserted into the second side wall 1173.

With reference to FIG. 2, FIG. 7, FIG. 9 and FIG. 11, the fixed block 1135 is provided with a connector 1136 on its upper protrusion. The connector 1136 can be inserted into the second interface 112 via the first hole. The connector 1136 can prop the relative inner side of the second interface 112 so that the second side wall 1173 and the connector 1136 can hold and conveniently secure the second interface 112. Moreover, a probe can be mounted on the connector 1136 to better detect the state of the cell 119 corresponding to the second interface 112. Together with reference to FIG. 8, in the embodiment, the signal acquisition module 1137 comprises a temperature probe 1139 mounted on the connector 1136 for detecting the temperature of the cell 119 corresponding to the second interface 112. The temperature probe 1139 mounted on the connector 1136 can extend into the second interface 112 via the first hole to get closer to the cell 119 corresponding to the second interface 112 for more accurate detection of the temperature state of the cell 119.

The signal acquisition module 1137 also comprises two probes 1138 that are electrically connected with the positive and negative electrodes of the cell 119 corresponding to the second interface 112 to detect the voltage of the cell 119. The two probes 1138 are mounted on the fixed block 1135. The connecting seat 115 also comprises a pin electrode 118, which is connected with the side of the cell 119 corresponding to the second interface 112 and fixed on the insulated enclosure 116. The pin electrode 118 and the supporting plate 1171 are set apart. One of the two probes 1138 contacts the pin electrode 118 and the other contact the supporting plate 1171 of the connecting electrode 117. The connecting electrodes 117 is electrically connected to the positive electrode of the cell 119 corresponding to the second interface 112 and the pin electrode 118 is connected to the side of the cell 119, namely, the pin electrode 118 is electrically connected with the negative electrode of the cell 119, so the two probes 1138 are electrically connected to the positive and negative electrodes of the cell 119 to measure the voltage of the cell 119.

The pin electrode 118 has an L-shaped cross section, which comprises two connected sections: an insertion section 1181 and a propping section 1182. The propping section 1182 is used to prop the side of the cell 119 corresponding to the second interface 112 to enable the pin electrode 118 to be connected to the negative electrode of the cell 119. The insertion section 1181 is used to prop one probe 1138 to enable the pin electrode 118 to be connected to this probe 1138. The insertion section 1181 is inserted in the insulated enclosure 116 to secure the pin electrode 118.

In the embodiment, the insertion section 1181 is positioned on one side of the supporting plate 1171 corresponding to the second side wall 1173. A second hole 1177 is set in the position of the one probe 1138 on the supporting plate 1171. A third hole 1166 exposing part of the insertion section 1181 is set in the position corresponding to the second hole 1177 on the insulated enclosure 116. After the fixed block 1135 of the acquisition board assembly 113 is inserted into the connecting seat 115, one of the two probes 1138 on the fixed block 1135 passes through the second hole 1177, extends into the third hole 1166 and props the insertion section 1181 of the pin electrode 118; the other probe 1138 directly props the supporting plate 1171 and becomes electrically connected to the negative and positive electrodes of the cell 119 corresponding to the second interface 112.

The part of insertion section 1181 in the third hole 1166 is provided with a first recess 1183 to accommodate corresponding probe 1138. The first recess 1183 can guide and protect the probe 1138 when the probe 1138 props the insertion section 1181 of the pin electrode 118. The first recess 1183 can also hold the insertion section 1181 of the pin electrode 118 in the insulated enclosure 116 to enable more stable mounting of the pin electrode 118. To better protect the probe 1138, a second recess 1176 is set in the position of the other probe 1138 on the supporting plate 1171 to accommodate the probe 1138.

In other embodiments, the insertion section 1181 of the pin electrode 118 can also be provided on one side of the supporting plate 1171 corresponding to the first side wall 1172. One example is to set a gap on the first side wall 1172 to accommodate the insert section 1181 so that the insertion section 1181 is provided on the supporting plate 1171. This also enables the two probes 1138 to respectively prop the insertion section 1181 of the pin electrode 118 and the supporting plate 1171 of the connecting electrode 117.

The connecting electrode 117 can be formed by stamping metal; its production is simple and convenient. The pin electrode 118 can be made by bending metal plate or formed by stamping metal.

Figure 10:
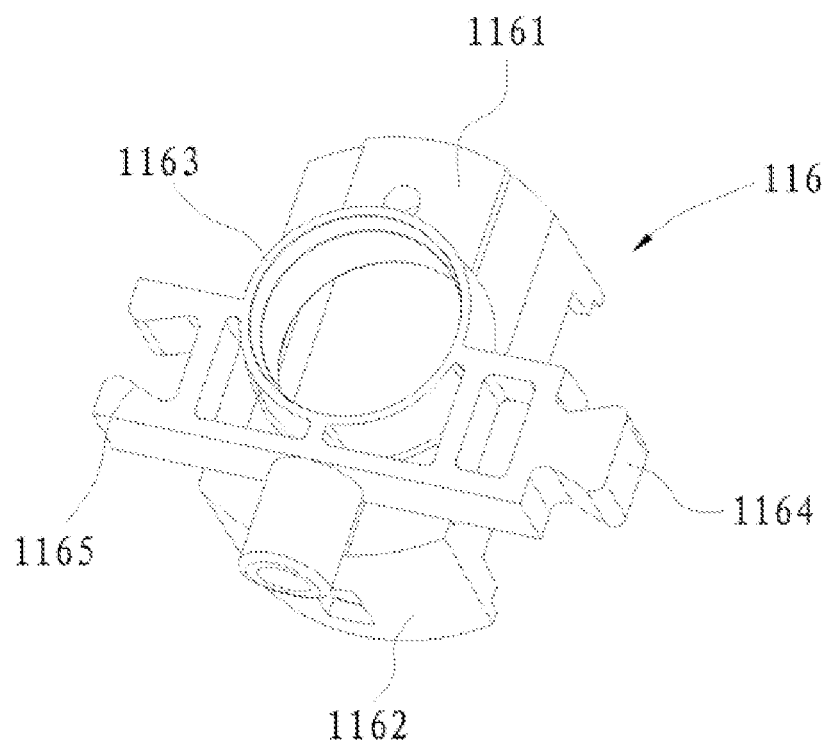
FIG. 10 depicts an enlarged perspective view of the insulated enclosure for the connecting seat shown in FIG. 9.

With reference to FIG. 3, FIG. 9 and FIG. 10, the insulated enclosure 116 comprises a supporting seat 1161, a first side plate 1162 and a second side plate 1163. The first side plate 1162 and the second side plate 1163 are respectively fixed on opposite sides of the supporting seat on 1161. The supporting plate 1171 is mounted and supported on the supporting seat 1161 to increase the strength of the supporting plate 1171. The first side plate 1162 is wrapped on the outside of the first side wall 1172 and the second side plate 1163 is wrapped on outside of the second side wall 1173 so that the first side plate 1162 and the second side plate 1163 can secure the first side wall 1172 and the second side wall 1173. This enables the first interface 111 and the second interface 112 to be connected with the connecting seat 115 more stably.

With reference to FIG. 3, FIG. 9 and FIG. 10, one side of the insulated enclosure 116 is also provided with a connecting insertion block 1164, and the opposite side of the insulated enclosure 116 is provided with a socket 1165 to accommodate the connecting insertion block 1164 of another insulated enclosure 116. With the connecting insertion block 1164 and the socket 1165 on the insulated enclosure 116, when multiple groups of series-connected cells 119 are arranged side by side, multiple connecting seats 115 can be connected to increase the connection stability of the cells 119 and more securely mount connecting seats 115.

Figure 4:
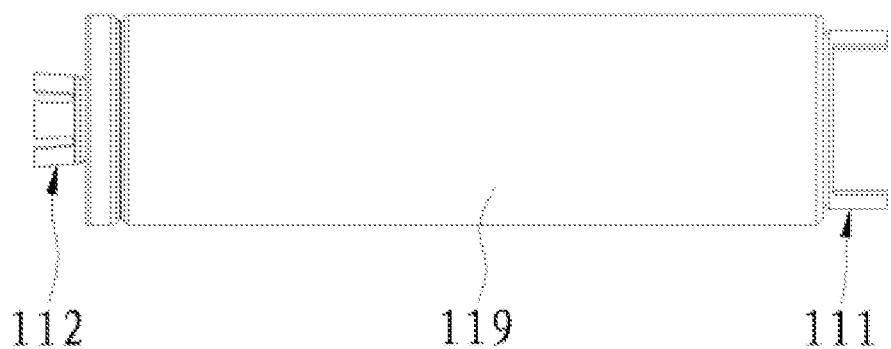
FIG. 4 depicts elevation view of the cell in FIG. 2 and also shows a first interface and a second interface.
Figure 5:
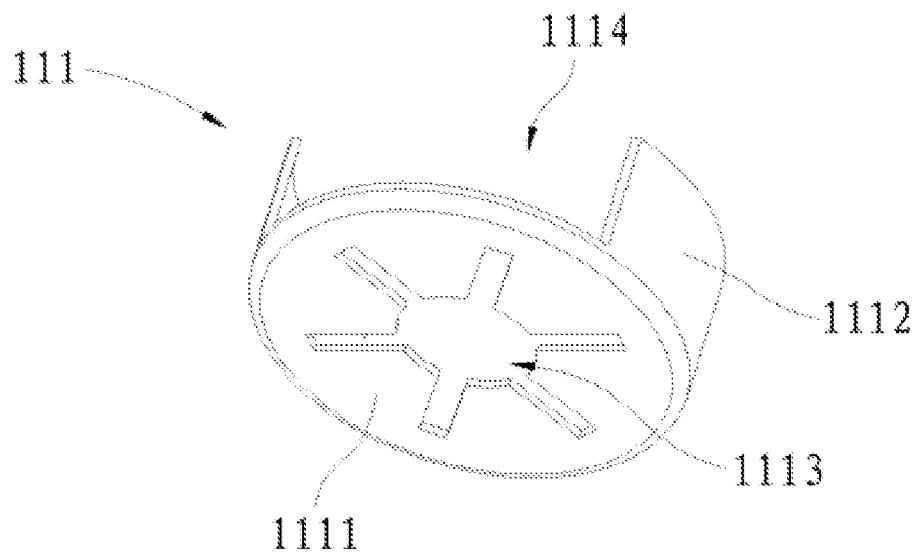
FIG. 5 depicts an enlarged view of the first interface shown in FIG. 4.

With reference to FIG. 3, FIG. 4 and FIG. 5, the first interface 111 comprises a first metal base plate 1111 and two first metal side walls 1112. The first metal base plate 1111 is used for secure connection with the bottom of a corresponding cell 119. The two first metal side walls 1112 are inserted in the connecting seat 115. The two first metal side walls 1112 are positioned opposite to each other on the first metal base plate 1111. Between the two first metal side walls 1112 is an opening 1114 to accommodate the extension from the connecting part 1132 of the PCB 1131. The first metal side walls 1112 may be perpendicular to the first metal base plate 1111 or may have a certain angle with the normal direction of the first metal base plate 1111. Between the two first metal side walls 1112 is an opening 1114 to accommodate the extension from the connecting part 1132 of the PCB 1131 so that the signal acquisition module 1137 on the fixed block 1135 and the signal processing module 1133 on the PCB 1131 can be electrically connected.

The first metal base plate 1111 has a first through hole 1113 to facilitate the first metal base plate 1111 to be fixed on the bottom of the cell 119. The first through hole 1113 in the first metal base plate 1111 enables glue and solder to flow through the first through hole 1113 to the area between the first metal base plate 1111 and the bottom of the cell 119, facilitating the first metal base plate 1111 to be fixed to the bottom of the cell 119.

Specifically, the first metal base plate 1111 is round and the first metal side wall 1112 is arc-shaped, running parallel to the cross section of the first metal base plate 1111. The round first metal base plate 1111 facilitates fitting with the bottom of the cell 119. In other embodiments, the first metal base plate may be in another shape, such as square and rectangle.

Figure 6:
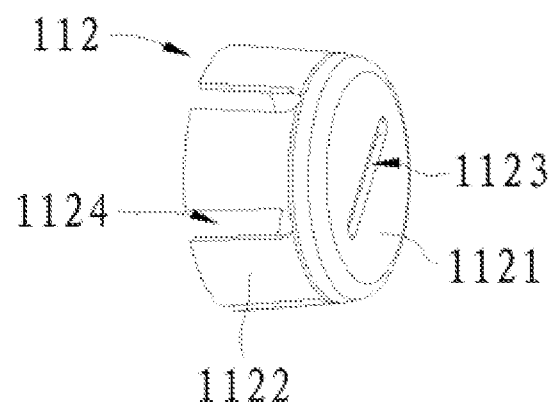
FIG. 6 depicts an enlarged view of the second interface shown in FIG. 4.

With reference to FIG. 3, FIG. 4 and FIG. 6, the second interface 112 comprises a second metal base plate 1121 and second metal side wall 1122. The second metal base plate 1121 is used for secure connection with the top of a corresponding cell 119. The second metal side wall 1122 is inserted in the connecting seat 115. The second metal side wall 1122 is provided in a circle on the second metal base plate 1121.

The second metal base plate 1121 has a second through hole 1123 to facilitate the second metal base plate 1121 to be fixed on the top of the cell 119. The second through hole 1123 in the second metal base plate 1121 enables glue and solder to flow through the second through hole 1123 to the area between the second metal base plate 1121 and the top of the cell 119, facilitating the second metal base plate 1121 to be fixed to the top of the cell 119.

Specifically, the second metal base plate 1121 is round, which facilitates fitting with the top of the cell 119. In other embodiments, the second metal base plate 1121 may be in another shape, such as square and rectangle.

The second metal side wall 1122 may be perpendicular to the second metal base plate 1121 or may have a certain angle with the normal direction of the second metal base plate 1121. In this embodiment, the second metal side wall 1122 gradually expands, with an outward inclined taper along its height direction. The height direction of the second metal side wall 1122 is perpendicular to the second metal base plate 1121 and far away from the direction of the second metal base plate 1121. The gradual expansion shape of the second metal side wall 1122 enables the second metal side wall 1122 to be held in the connecting seat 115 after the second metal side wall 1122 is inserted into the connecting seat 115, increasing the stability of connection between the second metal side wall 1122 and the connecting seat 115. Together with reference to FIG. 9, the angle between the second metal side wall 1122 and the normal direction of the second metal base plate 1121 may preferably be the same as that between the contraction section 1174 in the second side wall 1173 of the connecting electrode 117 and the normal direction of the supporting plate 1171 so that the second metal side wall 1122 of the second interface 112 can be better connected to the second side wall 1173 of the connecting electrode 117.

Several long and narrow gaps are set along the height direction of the second metal side wall 1122. The long and narrow gaps 1124 in the second metal side wall 1122 enables the second metal side wall 1122 to have a certain flexibility of contracting inward after it is inserted into the connecting seat 115, facilitating its insertion into the connecting seat 115.

The invention is also intended to provide a power battery comprising multiple cells and the cell state acquisition apparatus, on which the cells are mounted. Use of the cell state acquisition apparatus for the power battery reduces and shortens connection wires, saves the layout space and increases the heat dissipation space and efficiency for the cells. Thereby, more cells can be set in the same volume, increasing the electric capacity of a power battery.

The power battery with cell state acquisition apparatus has the following operating modes:

Charge Mode:

During normal charge (0.5 C), in the first 30 min of charge, the temperature and voltage states of the cells will be acquired every 5 min; after the first 30 min, acquisition will be carried out every 15 min.

During quick charge (1.0 C), in the first 30 min of charge, the temperature and voltage states of the cells will be acquired every 3 min; after the first 30 min, acquisition will be carried out every 15 min.

During charge, after the power battery voltage reaches 290.5 V (4.15 V*70), namely, each cell voltage reaches 4.15 V, if the charging current of a group of series-connected cells becomes 200 mA, the group of series-connected cells will get into the balance state. At this moment, each cell voltage will be acquired every 5 min. After the charge current of all the six or multiple groups of series-connected cells is 200 mA, balance will alternates and each balance cycle will last for 45 s.

(Note: During charge, cells do not heat up in general unless they become abnormal)

Discharge Mode:

In the first 30 min of discharge, the temperature of the cells will be acquired every 10 min; after the first 30 min, acquisition will be carried out every 15 min.

In the early period of discharge, the voltage of the cells will not be acquired. When the total voltage becomes lower than 518 V (3.7 V*140), namely, each cell voltage becomes lower than 3.7 V, the acquisition board assembly 113 will acquire voltage once. The main control MCU of the power battery will issue an instruction after analysis to allow each relevant acquisition board assembly 113 to acquire voltage every 15 min for corresponding cell with voltage lower than 3.6 V.

In the last 30 min of discharge, the temperature and voltage of the cells will be acquired every 5 min.

(Note: In general, after 30 min of discharge at 1.0 C, cells would begin to heat up and the discharge current of each series-connected cells in the power battery would not exceed 3.1 A (1.0 C=3 A)).

Standby Mode:

In the intervals between acquisitions, only the communication module 1136 is operating.

Data Abnormity Handling:

When temperature or voltage of a cell becomes abnormal, the abnormal data and the address of the cell will be sent to the main control MCU of the power battery immediately.

Data Acquisition and Processing Modules

Temperature Acquisition and Processing:

The temperature of each cell will be acquired for 10 times; their average (with calculation formula (2)) will be calculated and compared with the reference value to determine whether the data is abnormal; and the average of the 5th and 6th temperature values (with calculation formula (1)) will then be calculated. The acquisition speed is determined depending on the speed of the AD converter. (Temperature range during charge: 0~45° C.; temperature range during discharge: −20~60° C.; reference temperature during charge: 35° C.; reference temperature during discharge: 50° C.; normal temperature: 25° C.).

Voltage Acquisition and Processing:

The signal acquisition module 1137 on the fixed block 1135 of each acquisition board assembly successively acquires the voltage of connected cells and the acquisition for each cell will last for 4 ins. When 10 acquisition cycles are complete, the voltage value of each cell has been acquired for 10 times; their average (with calculation formula (2)) will be calculated and compared with the reference value to determine whether the data is abnormal; and the average of the 5th and 6th temperature values (with calculation formula (1)) will then be calculated. (Voltage range during charge: 4.05 V~4.25 V; reference voltage value during charge: 4.15V; reference voltage values during discharge: 3.0 V (2.9 V), 3.7 V (3.6 V))

Average Calculation Formulas

Calculation formula (1): For 10 values, the maximum and minimum values will be removed, and then the average will be calculated.

Calculation formula (2): 10 values will be arranged in a descending order, and the average of the 5th and 6th values will be calculated.

Operating Mode of the Communication Module

Transmission mode: address code of acquisition board assembly, address code of cell 1, temperature value of cell 1, voltage value of cell 1, address code of cell 2, temperature value of cell 2, voltage value of cell 2, address code of cell 3, temperature value of cell 3, voltage value of cell 3, address code of cell 4, temperature value of cell 4, voltage value of cell 4, address code of cell 5, temperature value of cell 5, voltage value of cell 5, address code of cell 6, temperature value of cell 6, voltage value of cell 6, average temperature value, average voltage value, and end code.

Abnormal data and the address code of the cell will be sent with a prefixed warning sign immediately with high priority.

Reception mode: Receive instructions in the manner of interruption.

Although the present invention has been illustrated and described herein with reference to preferred embodiments, it should not be construed as limiting the scope of the invention. Any modifications, equivalent substitutions and improvements that are within the spirit and principle of the invention are intended to be covered by the protection scope of the invention.

What is claimed is:

1. A cell state acquisition apparatus for acquiring state signals of monitored cells, wherein the apparatus comprises an acquisition board assembly placed between adjacent cells connected in series, a first interface fixed to a bottom surface of one cell of the adjacent cells as a negative electrode, a second interface fixed to a top surface of another cell of the adjacent cells as a positive electrode, the top surface of the another cell facing the bottom surface of the one cell, and a connecting seat configured to connect the first interface with the second interface; the first interface comprises a first metal base plate configured to fix and connect to the bottom surface of the one cell of the adjacent cells, and two first metal side walls to be inserted in the connecting seat; the second interface comprises a second metal base plate configured to fix and connect to the top of the another cell of the adjacent cells, and a second metal side wall to be inserted in the connecting seat; the first interface and the second interface are inserted oppositely into the connecting seat; the acquisition board assembly comprises a printed circuit board (PCB), a signal processing module mounted on the PCB, a communication module mounted on the PCB, and a fixed block; the PCB has a connecting part; the fixed block is mounted on the connecting part, both the fixed block and the connecting part are inserted in the first interface; the fixed block is provided with a signal acquisition module for acquisition of the cell state signals of the another cell connected with the second interface.

2. The cell state acquisition apparatus according to claim 1, wherein the connecting seat comprises a connecting electrode for electrically connecting the first interface and the second interface and an insulated enclosure for encasing the connecting electrode; the connecting electrode comprises a supporting plate, a first side wall for propping the relative outer side of the first interface and a second side wall for propping the relative outer side of the second interface; the first side wall and the second side wall are respectively arranged on opposite sides of the supporting plate.

3. The cell state acquisition apparatus according to claim 2, wherein the first side wall is divided into two pieces arranged at two opposite ends of the supporting plate.

4. The cell state acquisition apparatus according to claim 3, wherein the second side wall is provided at the edge of the supporting plate.

5. The cell state acquisition apparatus according to claim 2, wherein the second side wall in the shape of a sleeve is provided on the middle part of the supporting plate, and the supporting plate has a first hole in the position where the second side wall is set.

6. The cell state acquisition apparatus according to claim 5, wherein the second side wall comprises a contraction section, which contracts inwards from the supporting plate and along the axial direction of the second side wall.

7. The cell state acquisition apparatus according to claim 6, wherein the second side wall comprises a guiding section, which expands outwards from the contraction section and along the axial direction of the second side wall.

8. The cell state acquisition apparatus according to claim 5, wherein the fixed block is provided thereon with a protruding connector inserted into the second interface via the first hole.

9. The cell state acquisition apparatus according to claim 8, wherein the signal acquisition module comprises a temperature probe mounted on the connector for detecting the temperature of the another cell connected with the second interface.

10. The cell state acquisition apparatus according to claim 2, wherein the signal acquisition module also comprises two probes that are respectively electrically connected with the positive electrode and a negative electrode of the another cell connected with the second interface to detect the voltage of the another cell; the two probes are mounted on the fixed block; the connecting seat also comprises a pin electrode which is connected with one side of the another cell connected with the second interface and is fixed on the insulated enclosure; the pin electrode and the supporting plate are set apart.

11. The cell state acquisition apparatus according to claim 10, wherein the pin electrode has an L-shaped cross section, which comprises two connected sections: an insertion section inserted in the insulated enclosure for propping one probe and a propping section for propping the side of the another cell connected with the second interface.

12. The cell state acquisition apparatus according to claim 11, wherein the insertion section is positioned on one side of the supporting plate corresponding to the second side wall; a second hole is set in the position of the probe propped by the insertion section on the supporting plate; and a third hole exposing part of the insertion section is set in the position corresponding to the second hole on the insulated enclosure.

13. The cell state acquisition apparatus according to claim 12, wherein one part of insertion section is located in the third hole and is provided with a first recess to accommodate the probe propped by the insertion section.

14. The cell state acquisition apparatus according to claim 13, wherein a second recess is set in the position of the other probe on the supporting plate to accommodate the probe.

15. The cell state acquisition apparatus according to claim 2, wherein the insulated enclosure comprises a supporting seat that fixes the supporting plate, a first side plate wrapped on the outside of the first side wall, and a second side plate wrapped on the outside of the second side wall; the first side plate and the second side plate are respectively fixed on opposite sides of the supporting seat.

16. The cell state acquisition apparatus according to claim 15, wherein one side of the insulated enclosure is further provided with a connecting insertion block, and the opposite side of the insulated enclosure is provided with a socket to accommodate the connecting insertion block of another insulated enclosure.

17. The cell state acquisition apparatus according to claim 1, wherein the two first metal side walls are positioned opposite to each other on the first metal base plate, with an opening between them to accommodate the connecting part of the PCB.

18. The cell state acquisition apparatus according to claim 17, wherein the first metal base plate has a first through hole to help the first metal base plate be fixed on the bottom of the one cell.

19. The cell state acquisition apparatus according to claim 17, wherein the first metal base plate is round and the first metal side wall is arc-shaped, running parallel to the cross section of the first metal base plate.

20. The cell state acquisition apparatus according to claim 1, wherein the second metal side wall is provided in a circle on the second metal base plate.

21. The cell state acquisition apparatus according to claim 20, wherein the second metal base plate has a second through hole to facilitate the second metal base plate to be fixed on the top of the another cell.

22. The cell state acquisition apparatus according to claim 20, wherein the second metal base plate is round.

23. The cell state acquisition apparatus according to claim 22, wherein the second metal side wall gradually expands, with an outward inclined taper along its height direction.

24. The cell state acquisition apparatus according to claim 23, wherein several long and narrow gaps are set along the height direction of the second metal side wall.

25. The cell state acquisition apparatus according to claim 1, wherein the PCB is provided with multiple connecting parts, each of the connecting parts is provided with a fixed block.

26. A power battery, comprising several cells, wherein the power battery further comprises the cell state acquisition apparatus according to claim 1 and the adjacent cells are mounted on the cell state acquisition apparatus.

\* \* \* \* \*